(12) United States Patent
Gerlach et al.

(10) Patent No.: US 8,981,864 B2
(45) Date of Patent: Mar. 17, 2015

(54) MULTI-LAYER INTEGRATED TRANSMISSION LINE CIRCUITS HAVING A METAL ROUTING LAYER THAT REDUCES DIELECTRIC LOSSES

(75) Inventors: Daniel L. Gerlach, Bethelem, PA (US); Ashley Rebelo, Allentown, PA (US)

(73) Assignee: LSI Corporation, Milpitas, CA (US)

( * ) Notice: Subject to any disclaimer, the term of this patent is extended or adjusted under 35 U.S.C. 154(b) by 232 days.

(21) Appl. No.: 13/460,243

(22) Filed: Apr. 30, 2012

(65) Prior Publication Data

US 2013/0285769 A1    Oct. 31, 2013

(51) Int. Cl.
    *H01P 3/08* (2006.01)
(52) U.S. Cl.
    CPC ............... *H01P 3/082* (2013.01); *H01P 3/088* (2013.01)
    USPC .............................................. 333/1; 333/238
(58) Field of Classification Search
    CPC ........... H01P 3/08; H01P 3/081; H01P 3/082; H01P 3/085; H01P 3/088
    USPC ..................................................... 333/1, 238
    See application file for complete search history.

(56) References Cited

U.S. PATENT DOCUMENTS

| | | | | |
|---|---|---|---|---|
| 2,800,634 A | * | 7/1957 | Grieg et al. | 333/238 |
| 4,644,093 A | * | 2/1987 | Yoshihara et al. | 174/36 |
| 5,805,037 A | * | 9/1998 | Forse et al. | 333/238 |
| 7,202,758 B2 | * | 4/2007 | Hsu | 333/33 |

OTHER PUBLICATIONS

Albertsen, A., "LTCC Technology for Sensor- and RF-Applications," Bodo's Power System, http://www.bodospower.com, pp. 38-39 (Dec. 2007).

* cited by examiner

*Primary Examiner* — Benny Lee
(74) *Attorney, Agent, or Firm* — Sheridan Ross P.C.

(57) ABSTRACT

Multi-layer in integrated transmission line circuits are provided having improved signal loss characteristics. A multi-layer integrated transmission line circuit, such as a stripline circuit or a microstrip circuit, comprises at least one reference layer; at least one conducting layer having one or more conducting strips, wherein the at least one conducting layer is separated from the at least one reference layer by a substrate; and at least one additional layer positioned between the at least one conducting layer and the at least one reference layer. The multi-layer integrated transmission line circuit may also comprise a dielectric insulating material, such as an organic material or a ceramic material. The additional layers increase a dielectric thickness of the multi-layer integrated transmission line circuit to reduce dielectric losses.

20 Claims, 2 Drawing Sheets

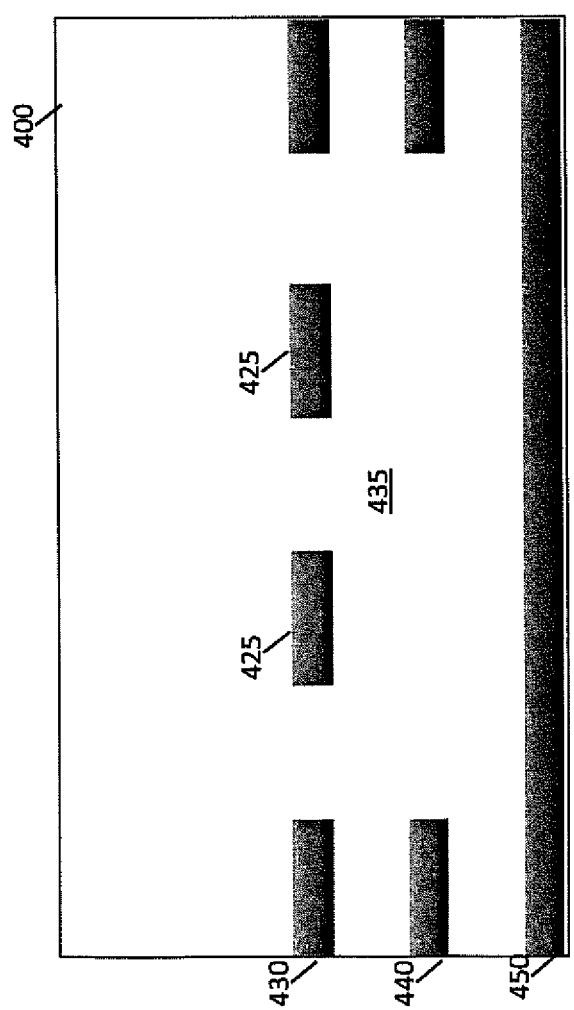

000000
MULTI-LAYER INTEGRATED TRANSMISSION LINE CIRCUITS HAVING A METAL ROUTING LAYER THAT REDUCES DIELECTRIC LOSSES

BACKGROUND

When signals have a frequency in the radio frequency (RF) range or higher, ordinary electrical cables are insufficient. Transmission lines, however, are known to carry such signals with reduced reflections and power losses. Transmission lines include coaxial cables, optical fibers, waveguides, striplines and microstrips. Generally, transmission lines are used when the frequency of the signal is high enough that the wavelength of the signal approaches the length of the cable. Multi-layer integrated transmission line circuits, such as striplines and microstrips, are used for various applications, such as connecting high speed communication devices and distributing cable television signals.

A stripline circuit is a transmission line that uses a conducting strip of metal positioned between two parallel ground (reference) and/or power planes that provide an AC current return path. The insulating material of the substrate forms a dielectric. The width of the strip, the thickness of the substrate and the relative permittivity of the substrate determine the characteristic impedance of the stripline. A microstrip circuit is a transmission line that uses a conducting strip of metal separated from a single reference plane by a dielectric layer (substrate).

While existing transmission lines, such as striplines and microstrips, have reduced the insertion loss for signals in the RF range and higher, additional robustness to signal loss is required to satisfy the insertion loss targets that are required for evolving higher data rate systems. For example, as data rates are moving towards 28 GBps, signal losses have become even more important in the total system budget. Tangent loss of the dielectric material in the substrate is a significant contributor to overall loss in the substrate. Tangent loss tends to be lower in integrated circuit (IC) packages fabricated using ceramic materials than in IC packages fabricated using organic materials. Generally, however, ceramic IC packages are significantly more expensive than organic IC packages. A need therefore exists for improved techniques for reducing the signal losses in multi-layer integrated transmission line circuits, such as striplines and microstrips.

SUMMARY

Generally, multi-layer integrated transmission line circuits are provided having improved signal loss characteristics. The multi-layer integrated transmission line circuits comprise, for example, stripline circuits and microstrip circuits. According to one aspect of the invention, a multi-layer integrated transmission line circuit comprises at least one reference layer; at least one conducting layer having one or more conducting strips, wherein the at least one conducting layer is separated from the at least one reference layer by a substrate; and at least one additional layer positioned between the at least one conducting layer and the at least one reference layer. The multi-layer integrated transmission line circuit may also comprise a dielectric insulating material, such as an organic material or a ceramic material.

The additional layer can be, for example, an unused layer, or a layer that does not contain a conductor. Generally, the additional layers increase a dielectric thickness of the multi-layer integrated transmission line circuit, and thereby reduce dielectric losses of the multi-layer integrated transmission line circuit.

A more complete understanding of the present invention, as well as further features and advantages of the present invention, will be obtained by reference to the following detailed description and drawings.

BRIEF DESCRIPTION OF THE DRAWINGS

FIG. 4 illustrates a cross section of a microstrip circuit incorporating aspects of the present invention.

DETAILED DESCRIPTION

Aspects of the present invention provide improved techniques for reducing the signal losses in multi-layer integrated transmission line circuits, such as striplines and microstrips. While the present invention is illustrated herein primarily in the context of stripline circuits, the present invention can also be employed in other multi-layer integrated transmission line circuits, such as microstrips, as would be apparent to a person of ordinary skill in the art.

As indicated above, conventional stripline circuits have attempted to reduce signal losses by fabricating the stripline circuits using, ceramics materials. Ceramic IC packages, however, are significantly more expensive than organic packages. Aspects of the present invention reduce the signal losses in stripline circuits fabricated using organic materials by employing one or more additional layers between the metallic strip line and the reference (ground) planes. In other words, stripline circuits fabricated in accordance with aspects of the present invention have at least one metal routing layer between the metallic strip line and the reference (ground) planes that is not used. In this manner, the dielectric thickness of the stripline is increased and the dielectric losses are reduced.

Figure 1:
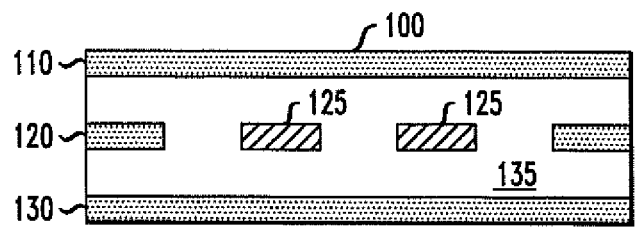
FIGS. 1 and 2 illustrate cross sections of conventional stripline circuits.

FIG. 1 illustrates a cross section of a conventional stripline circuit 100. As shown in FIG. 1, the conventional stripline circuit 100 comprises a signal layer 120 comprised of one or more strips of metal 125 positioned between two parallel reference (ground) planes 110, 130. In addition, the dielectric insulating material 135 of the substrate comprises an organic material.

As indicated above, the width of the metal strips 125, the thickness of the substrate and the relative permittivity of the substrate determine the characteristic impedance of the stripline circuit 100. It is noted that the metal strips 125 need not be equally spaced between the reference planes 110, 130. In addition, the dielectric material 135 may be different above and below the metal strips 125.

The conventional stripline circuit 100 may be fabricated, for example, by etching the one or more strips of metal 125 on a substrate that has a reference (ground) plane 110 on the opposite face. Thereafter, a second substrate (which is metallized on only one surface) can be adhesively attaching on top of the surface with the etched strips of metal 125 to achieve the second reference plane 130. For a more detailed discussion of suitable techniques for fabricating conventional stripline circuits 100, see, for example, by William J. Greig, "Substrate Manufacturing Technologies: Organic Packages and Interconnect Substrate." Ch. 15 in Integrated Circuit Packaging, Assembly and Interconnections, 245-260, (2007), (http://www.springerlink.com/content/x011438768541h55/), incorporated by reference herein.

Figure 2:
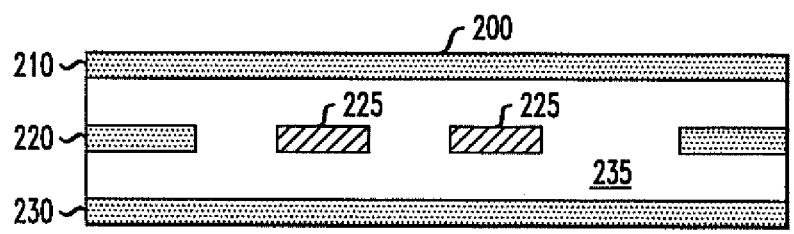

FIG. 2 illustrates a cross section of an alternate conventional stripline circuit 200. As shown in FIG. 2, the conventional stripline circuit 200 comprises a signal layer 220 comprised of one or more strips of metal 225 positioned between two parallel reference planes 210, 230. In addition, the dielectric insulating material 235 of the substrate comprises a ceramic material.

As indicated above, while ceramic stripline circuits 200 demonstrate improved signal loss characteristics relative to stripline circuits 100, ceramic IC packages are significantly more expensive to fabricate.

One aspect of the present invention provides improved signal loss characteristics in stripline circuits fabricated using organic dielectric materials. At least one metal routing layer between the metallic strip line and at least one reference plane is not used. The unused or additional layer(s) serves to increase the dielectric thickness of the stripline and thereby reduce the dielectric losses. The disclosed organic stripline circuits provide comparable loss targets as the ceramic stripline circuits 200 of FIG. 2, while maintaining the impedance targets. Please note that even though the organic package has a higher tangent loss, the amount of dielectric seen by the conductor has a larger area which decreases the total amount of loss for the signal.

Figure 3:
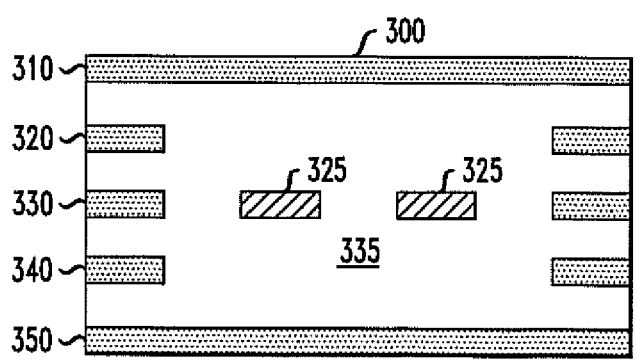
FIG. 3 illustrates a cross section of a stripline circuit incorporating aspects of the present invention.

FIG. 3 illustrates a cross section of a stripline circuit 300 incorporating aspects of the present invention. As shown in FIG. 3, the disclosed stripline circuit 300 comprises a signal layer 330 comprised of one or more strips of metal 325 positioned between two parallel reference planes 310, 350. At least one metal routing layer, such as layers 320, 340, between the metallic strip line and at least one reference plane are not used. The unused or additional layer(s) 320, 340 serve to increase the dielectric thickness of the stripline 300 and thereby reduce the dielectric losses. The dielectric insulating material 335 of the exemplary substrate comprises an organic material.

As indicated above, the width of the metal strips 325, the thickness of the substrate and the relative permittivity of the substrate determine the characteristic impedance of the stripline circuit 300. It is noted that the metal strips 325 need not be equally spaced between the reference planes 310, 350. In addition, the dielectric material 335 may be different above and below the metal strips 325.

The stripline circuit 300 may be fabricated, for example, by etching the one or more strips of metal 325 on a first substrate that is metalized on only one surface. Two additional substrates that are metalized on only one surface are also employed. These two additional substrates can be adhesively attached on top of each surface of the first substrate to achieve the stripline circuit 300. For a more detailed discussion of suitable techniques for fabricating stripline circuits 300, see, for example, William J. Greig, as referenced and incorporated by reference above.

A microstrip circuit is a transmission line that uses a conducting strip of metal separated from a single reference plane by a dielectric layer (substrate). FIG. 4 illustrates a cross section of a microstrip circuit 400 incorporating aspects of the present invention. As shown in FIG. 4, the disclosed microstrip circuit 400 comprises a signal layer 430 comprised of one or more strips of metal 425 positioned above a reference plane 450. At least one metal routing layer, such as layers 440, between the signal layer 430 and at least one reference plane 450 is not used. The unused or additional layer(s) 440 serve to increase the dielectric thickness of the exemplary microstrip circuit 400 and thereby reduce the dielectric losses. The dielectric insulating material 435 of the exemplary substrate comprises an organic material.

Signal Losses in Stripline Circuits

Losses are caused in stripline circuits by two mechanisms, both of which increase as signal frequency increase. Dielectric loss or the loss tangent is a parameter of a dielectric material that quantifies its inherent dissipation of electromagnetic energy. Conductor loss (resistance) is the loss attributed to skin effects. Skin effect is the tendency of an alternating current (AC) to distribute itself within a conductor, with the current density being largest near the surface of the conductor, decreasing at greater depths. The electric current flows mainly at the "skin" of the conductor, between the outer surface and a level called the skin depth. The skin effect causes the effective resistance of the conductor to increase at higher frequencies where the skin depth is smaller, thus reducing the effective, cross-section of the conductor.

Dielectric losses and conductor losses are additive. The dielectric loss can be considered as an effective series resistor (ESR) of the dielectric, as follows:

$$ESR = D_f/(w*C),$$

where $D_f$ is the dissipation factor (also referred to as tan delta or loss tangent) and is nearly constant (as a function of frequency) for a given dielectric material: w is the angular frequency and C is the lossless capacitance. Since the ESR is across the dielectric material, a smaller value of ESR increases signal amplitude loss and a higher ESR decreases signal amplitude loss. A perfect (lossless) dielectric would have a $D_f$ equal to zero or an infinitely large ESR.

The present invention recognizes that skipping at least one layer increases the thickness of the dielectric, thus decreasing the lossless capacitance and increasing the ESR to decrease the signal amplitude loss.

However, high speed signal transmission requires controlled or fixed impedance and by skipping layers (decreasing the capacitance), the width of the signal line must be increased to achieve the target impedance. For example, for an organic layer having a thickness of 30 um and for metal layers having a thickness of 15 um, skipping (or adding) one additional layer above and below (total of two) is sufficient. The increased width of the metal strips 325 decreases the conductor loss thus further decreasing the signal amplitude loss and increases the dielectric capacitance. For strip-line configurations, the increase in capacitance due to the increase in width of the metal strips 325 is less than the capacitance decrease realized by skipping layers. Thus, there is a net decrease in the capacitance.

At least a portion of the techniques of the present invention may be implemented in one or more ICs. In forming ICs, die are typically fabricated in a repeated pattern on a surface of a semiconductor wafer. Each of the die includes a stripline device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

An IC in accordance with the present invention can be employed in many application and/or electronic systems. Suitable systems for implementing the invention may include, but are not limited to, communication devices and devices for distributing cable television signals and other high speed signals. Systems incorporating such integrated circuits are considered part of this invention. Given the teachings of the invention provided herein, one of ordinary skill in the art will be able to contemplate other implementations and applications of the techniques of the invention.

Methods may be utilized to form an integrated circuit incorporating aspects of the present invention. The integrated circuit design can be created in a graphical computer programming language, and can be stored in a computer storage medium (such as a disk, tape, physical hard drive, or virtual hard drive such as in a storage access network). The stored design can be converted into the appropriate format (e.g., Graphic Design System II (GDSII)) for the fabrication of photolithographic masks, which typically include multiple copies of the integrated circuit design that are formed on a wafer. The photolithographic masks are utilized to define areas of the wafer (and or the layers thereon) to be etched or otherwise processed.

The resulting integrated circuits may be distributed by the fabricator in raw wafer form as a single wafer that has multiple unpackaged integrated circuits), as a bare die, or in packaged form. In the latter case, the integrated circuit is mounted in a single integrated circuit package (e.g., plastic carrier with leads that are affixed to a motherboard or other higher level carrier) or in a multi-integrated circuit package (e.g., ceramic carrier that has either or both surface interconnections or buried interconnections). In any case, the integrated circuit can be integrated with other chips, discrete circuit elements, and/or other signal processing devices as part of either an intermediate product (e.g., motherboard) or an end product. The end product may be an product that includes integrated circuits.

It is to be understood that the embodiments and variations shown and described herein are merely illustrative of the principles of this invention and that various modifications may be implemented by those skilled in the art without departing from the scope and spirit of the invention.

We claim:

1. A multi-layer integrated transmission line circuit, comprising:
    at least one reference layer;
    at least one conducting layer having one or more conducting strips, wherein said at least one conducting layer is separated from said at least one reference layer by a substrate; and
    at least one additional layer comprising a metal routing layer that reduces dielectric losses of said multi-layer integrated transmission line circuit positioned between said at least one conducting layer and said at least one reference layer.

2. The multi-layer integrated transmission line circuit of claim 1, wherein said multi-layer integrated transmission line circuit comprises one or more of a stripline circuit and a microstrip circuit.

3. The multi-layer integrated transmission line circuit of claim 1, wherein said at least one additional layer does not carry a signal.

4. The multi-layer integrated transmission line circuit of claim 1, wherein said at least one additional layer also includes a dielectric insulating material that does not contain a conductor.

5. The multi-layer integrated transmission line circuit of claim 1, wherein the metal routing layer does not carry a signal.

6. The multi-layer integrated transmission line circuit of claim 1, wherein said at least one additional layer increases a dielectric thickness of said multi-layer integrated transmission line circuit.

7. The multi-layer integrated transmission line circuit of claim 1, wherein a first additional layer is positioned to a first side of the at least one conducting layer and a second additional layer is positioned to a second side of the at least one conducting layer.

8. The multi-layer integrated transmission line circuit of claim 1, wherein one or more of the substrate and the one additional layer comprises a dielectric insulating material.

9. The multi-layer integrated transmission line circuit of claim 8, wherein said dielectric insulating material comprises one or more of an organic material and a ceramic material.

10. An integrated circuit comprising:
    a multi-layer integrated transmission line circuit, said multi-layer integrated transmission line circuit comprising:
    at least one reference layer;
    at least one conducting layer having one or more conducting strips, wherein said at least one conducting layer is separated from said at least one reference layer by a substrate; and
    at least one additional layer comprising a metal routing layer that reduces dielectric losses of said multi-layer integrated transmission line circuit positioned between said at least one conducting layer and said at least one reference layer.

11. The integrated circuit of claim 10, wherein said multi-layer integrated transmission line circuit comprises one or more of a stripline circuit and a microstrip circuit.

12. The integrated circuit of claim 10, wherein said at least one additional layer does not carry a signal.

13. The integrated circuit of claim 10, wherein said at least one additional layer also includes a dielectric insulating material that does not contain a conductor.

14. The integrated circuit of claim 10, wherein the metal routing layer does not carry a signal.

15. The integrated circuit of claim 10, wherein said at least one additional layer increases a dielectric thickness of said multi-layer integrated transmission line circuit.

16. The integrated circuit of claim 10, wherein a first additional layer is positioned to a first side of the at least one conducting layer and a second additional layer is positioned to a second side of the at least one conducting layer.

17. The integrated circuit of claim 10, wherein one or more of the substrate and the one additional layer comprises a dielectric insulating material.

18. The integrated circuit of claim 17, wherein said dielectric insulating material comprises one or more of an organic material and a ceramic material.

19. A method for fabricating a multi-layer integrated transmission line circuit, comprising:
    providing at least one reference layer;
    providing at least one conducting layer having one or more conducting strips, wherein said at least one conducting layer is separated from said at least one reference layer by a substrate; and
    providing at least one additional layer comprising a metal routing layer that reduces dielectric losses of said multi-layer integrated transmission line circuit positioned between said at least one conducting layer and said at least one reference layer.

20. The method of claim 19, wherein said multi-layer integrated transmission line circuit comprises one or more of a stripline circuit and a microstrip circuit.

* * * * *